(12) United States Patent
Lam

(10) Patent No.: US 7,304,535 B2
(45) Date of Patent: Dec. 4, 2007

(54) BALANCED AMPLIFIER

(76) Inventor: Chi Ming John Lam, Flat B, 7/F., Tower 3, Vista Paradiso, Ma On Shan, Shatin, New Territories, Hong Kong (CN)

(*) Notice: Subject to any disclaimer, the term of this patent is extended or adjusted under 35 U.S.C. 154(b) by 114 days.

(21) Appl. No.: 11/351,764

(22) Filed: Feb. 10, 2006

(65) Prior Publication Data

US 2007/0164816 A1    Jul. 19, 2007

(30) Foreign Application Priority Data

Jan. 5, 2006    (GB) ................................ 0600146.5

(51) Int. Cl.
*H03F 3/45* (2006.01)
(52) U.S. Cl. ......................................... 330/69; 330/99
(58) Field of Classification Search .................. 330/69, 330/99, 252, 260, 265
See application file for complete search history.

(56) References Cited

U.S. PATENT DOCUMENTS

| | | | |
|---|---|---|---|
| 2,281,238 A | 4/1942 | Greenwood ................ | 179/171 |
| 2,397,625 A | 4/1946 | Roche et al. ................ | 179/171 |
| 4,243,943 A | 1/1981 | Cherry ........................ | 330/100 |
| 4,320,351 A * | 3/1982 | Brown et al. ................ | 330/260 |
| 4,774,476 A | 9/1988 | Ecklund et al. | |
| 5,146,176 A * | 9/1992 | Evans .......................... | 330/69 |
| 6,388,516 B1 * | 5/2002 | Doran et al. ................... | 330/99 |

FOREIGN PATENT DOCUMENTS

| | | |
|---|---|---|
| DE | 19637292 | 4/1998 |
| EP | 813 296 A2 | 12/1997 |
| EP | 0 829 955 A1 | 3/1998 |
| GB | 933062 | 7/1963 |

\* cited by examiner

*Primary Examiner*—Henry Choe
(74) *Attorney, Agent, or Firm*—Ostrolenk, Faber, Gerb & Soffen, LLP

(57) ABSTRACT

A balanced amplifier is disclosed as comprising an input stage connected with a second stage, in which the input stage outputs signals to the second stage, and the first stage includes a first differential amplifier for receiving balanced input signals and is provided with two pairs of feedback loops, at least one of the pair of feedback loops for feedbacking part of signals outputted by the second stage to the first differential amplifier, and the second stage includes a second differential amplifier for amplifying signals received from the first stage and for maintaining the balanced signals.

20 Claims, 13 Drawing Sheets

US 7,304,535 B2

BALANCED AMPLIFIER

CROSS-REFERENCE TO RELATED APPLICATION

This application claims the benefit of the filing date of United Kingdom Patent Application No. 0600146.5 filed 5 Jan. 2006, the disclosure of which is hereby incorporated by reference.

BACKGROUND OF THE INVENTION

Semiconductor-based audio power amplifiers have been dominating the audio market since late 1960's. Advantages of employing semiconductor devices in audio signal amplification include compact size, cost effective power handling and high output power. However, the sound quality of semiconductor audio amplifiers is different from vacuum tube audio amplifier, and many audio consumers prefer the sound of amplifiers using vacuum tubes to those using semiconductors. In the high-end audio market, vacuum tube audio systems have gained a very favourable market share since its return in the late 1980's.

In the high-end audio applications, balanced topologies are often used in semiconductor amplifiers, both power and low-level (i.e., pre-amp and line amp) amplifiers. The advantage of employing balanced topology is that common mode noises and distortions can be cancelled out at the output. The result is a lower noise and lower distortion amplifier compared with amplifiers not employing any balanced topology. However, there has been very little development on vacuum tube balanced power amplifiers. Single-ended input is commonly used in vacuum tube amplifiers.

At present, there is a balanced topology found in vacuum tube power amplifier design. This balanced topology can be explained by viewing a power amplifier as having three separate amplifying stages, namely input stage (also called "first stage"), second stage (also called "driver stage") and output power stage (also called "output stage"). In such a topology, a pair of feedback loops is connected from the output power stage to the input stage.

For example, a functional block diagram and a circuit implementation of a conventional balanced amplifier using one pair of feedback paths is shown in FIGS. 7 and 8, respectively. A functional block diagram and a circuit implementation of a conventional complete balanced audio power amplifier in a push-pull configuration is illustrated in FIGS. 9 and 10.

From FIGS. 9 and 10, it can be easily seen that one single pair of feedback loops are connected between the output stage and the input stage. The applied feedback will generally improve the performance of the power amplifiers, i.e., lower output impedance, broader bandwidth and lower distortion. However, it is well known that if too much feedback is applied, it will render instability to the amplifier.

As is well known from the feedback theory, feedback will reduce distortion and output impedance, and increase the bandwidth of the overall power amplifier. Although these are all desirable features, as stated above, applying too much feedback will create instability to the amplifier, whereas applying too little feedback will not obtain the desired results. A designer thus always has difficulty in optimizing the overall power performance by using a single pair of feedback loops.

It is thus an object of the present invention to provide a balanced amplifier in which the aforesaid shortcomings are mitigated or at least to provide a useful alternative. In particular, the present invention provides a new balanced amplifier topology that can be employed in vacuum tube power amplifier applications for improving performance.

According to the present invention, there is provided a balanced amplifier comprising at least an input stage connected with a second stage, wherein said input stage is adapted to output signals to said second stage, wherein said first stage includes a first differential amplifier adapted to receive balanced input signals and is provided with two pairs of feedback loops, wherein at least one said pair of feedback loops are adapted to feedback part of signals outputted by said second stage to said first differential amplifier, and wherein said second stage includes a second differential amplifier adapted to amplify signals received from said first stage and is adapted to maintain said balanced signals.

BRIEF DESCRIPTION OF THE DRAWINGS

Embodiments of the present invention will now be described, by way of examples only, with reference to the accompanying drawings, in which.

DESCRIPTION OF A PREFERRED EMBODIMENT

Figure 1:
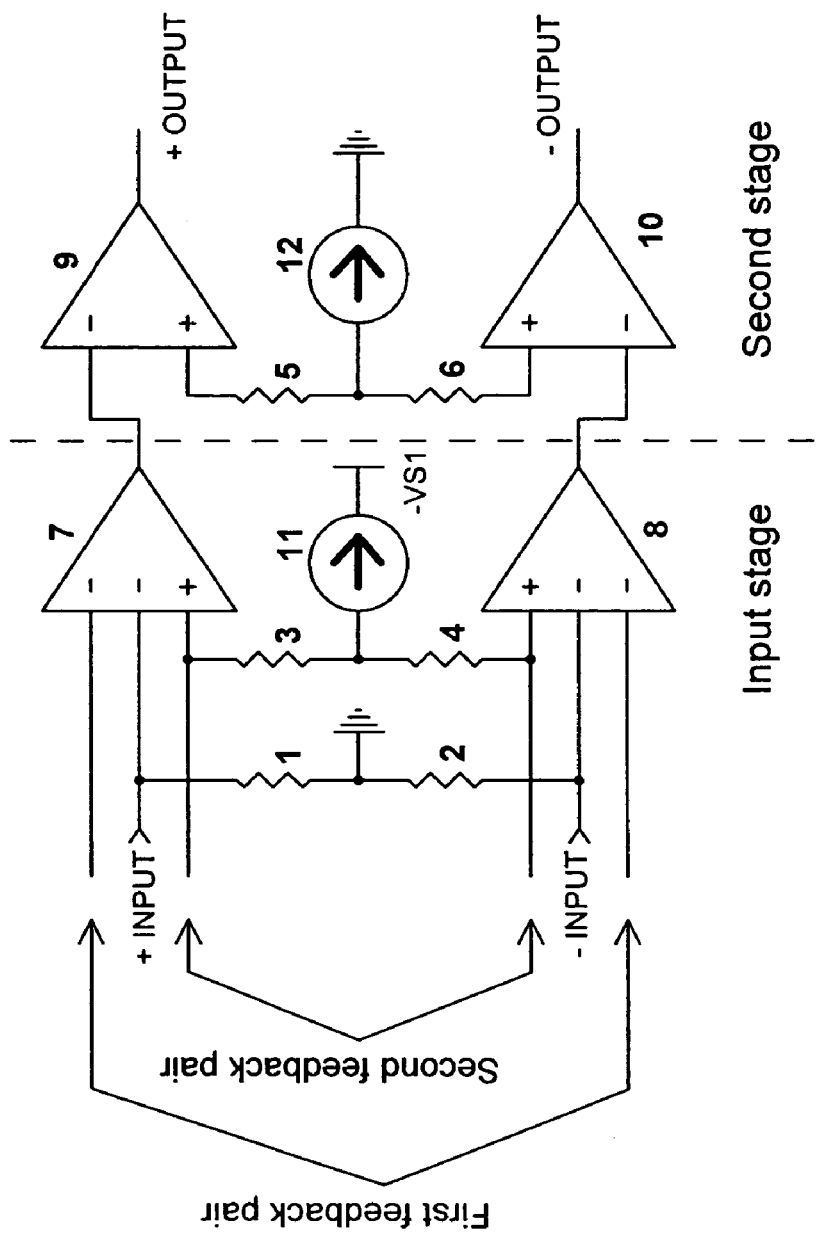
FIG. 1 is a functional block diagram of a vacuum tube balanced amplifier according to a first embodiment of the present invention.
Figure 2A:
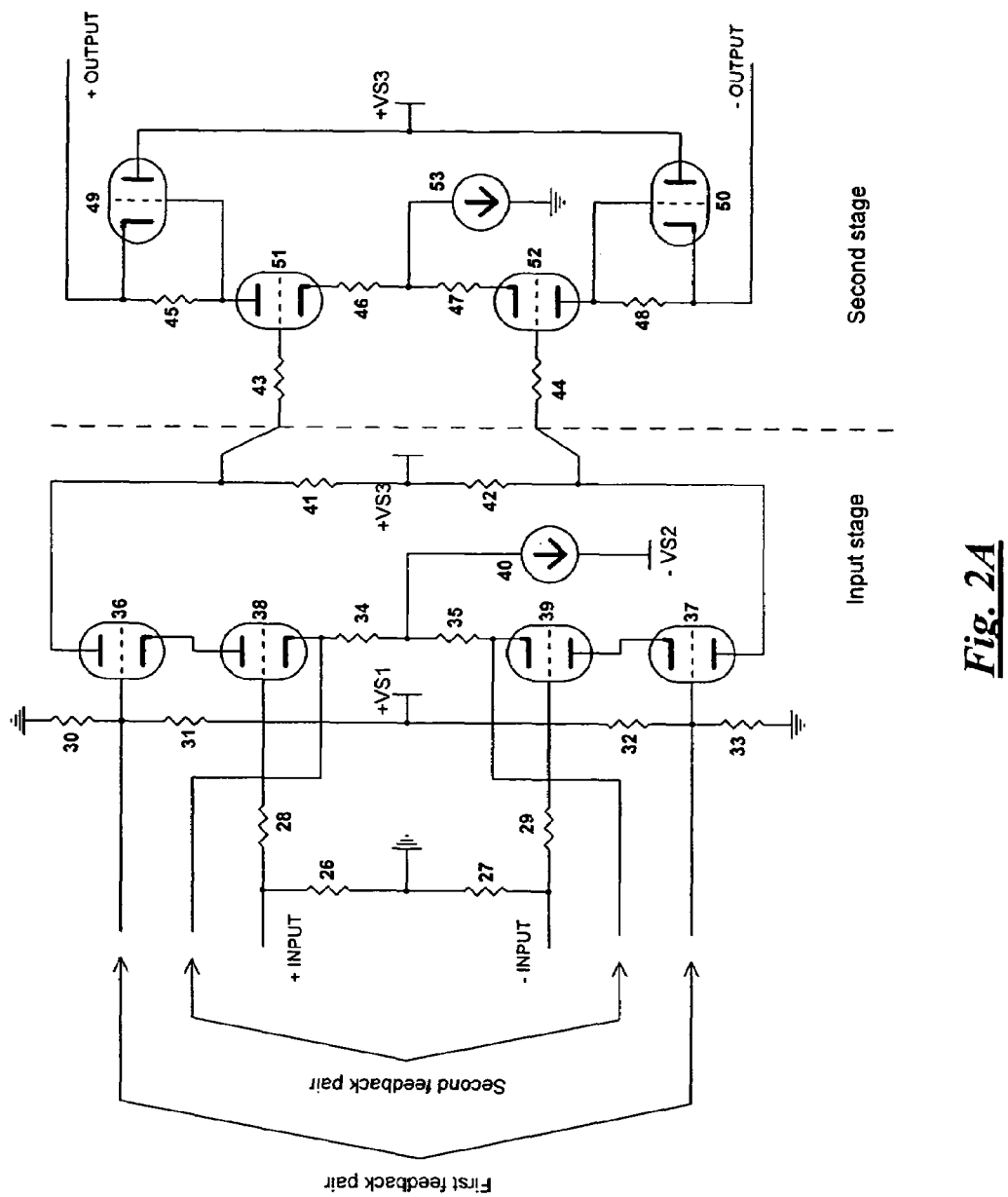
FIG. 2A is a detailed circuit arrangement of the vacuum tube balanced amplifier shown in FIG. 1.

A functional block diagram of a vacuum tube balanced amplifier according to a first embodiment of the present invention is shown in FIG. 1, and a detailed circuitry thereof shown in FIG. 2A.

As shown in FIG. 1, the first stage, which is a special type of differential amplifier, contains amplifying devices 7 and 8, resistors 1, 2, 3 and 4 and a current source 11. The first stage accepts balanced input signals (+INPUT & −INPUT) and provides two feedback pairs for signals on the following stage(s) to feedback portion of the output signals to this first stage.

The second stage, which is another type of special differential amplifier, contains amplifying devices 9 and 10, resistors 5 and 6, and a current source 12. The second stage amplifies the balanced signals from the first stage and maintains the balanced signals for the following amplifying stage or stages, if any.

More details are shown in FIG. 2A. The balanced amplifier includes four pairs of dual vacuum tubes, 36 and 37, 38 and 39, 49 and 50, and 51 and 52. These can be any of the commonly used small signal vacuum tubes such as 12AT7, 12AU7, 12AX7, 6DJ8, 6SN7 and 6SL7, etc.

The input stage is a special differential amplifier formed by vacuum tubes 36 and 37, and 38 and 39. Resistor 34 and 35 are local feedback resistors for reducing the voltage gain, while increasing linearity of this stage. They also minimize mismatching of the vacuum tubes 38 and 39 in DC biasing. A constant current source 40, which is connected to a negative DC supply voltage VS2, is used for setting the total DC biasing current for the input stage. The constant current source 40 can be easily implemented by a junction gate field-effect transistor (JFET), bipolar junction transistor (BJT) or metal-oxide-semiconductor field-effect transistor (MOSFET) with complementary components zener diode and resistors. In some practical situations, the current source can be replaced by a simple resistor. Resistors 30, 31, 32 and 33 form a potential divider that sets up the correct DC biasing voltage for the grids of the vacuum tube 36 and 37, respectively. The outputs of the input stage are directly coupled to the second stage via resistors 43 and 44.

The second stage is another differential amplifier which is formed by vacuum tubes 49 and 50, and 51 and 52. This is a differential amplifier which has a low output impedance so as to drive the output power stage of a power amplifier. A second constant current source 53 is used for setting the DC biasing current for the second stage.

It can be easily seen in FIGS. 1 and 2A that two feedback pairs are formed in the input stage. When an output power stage is connected to this balanced amplifier to form a complete balanced audio power amplifier, there are two possible ways of connecting the two pairs of feedback loops.

Figure 2B:
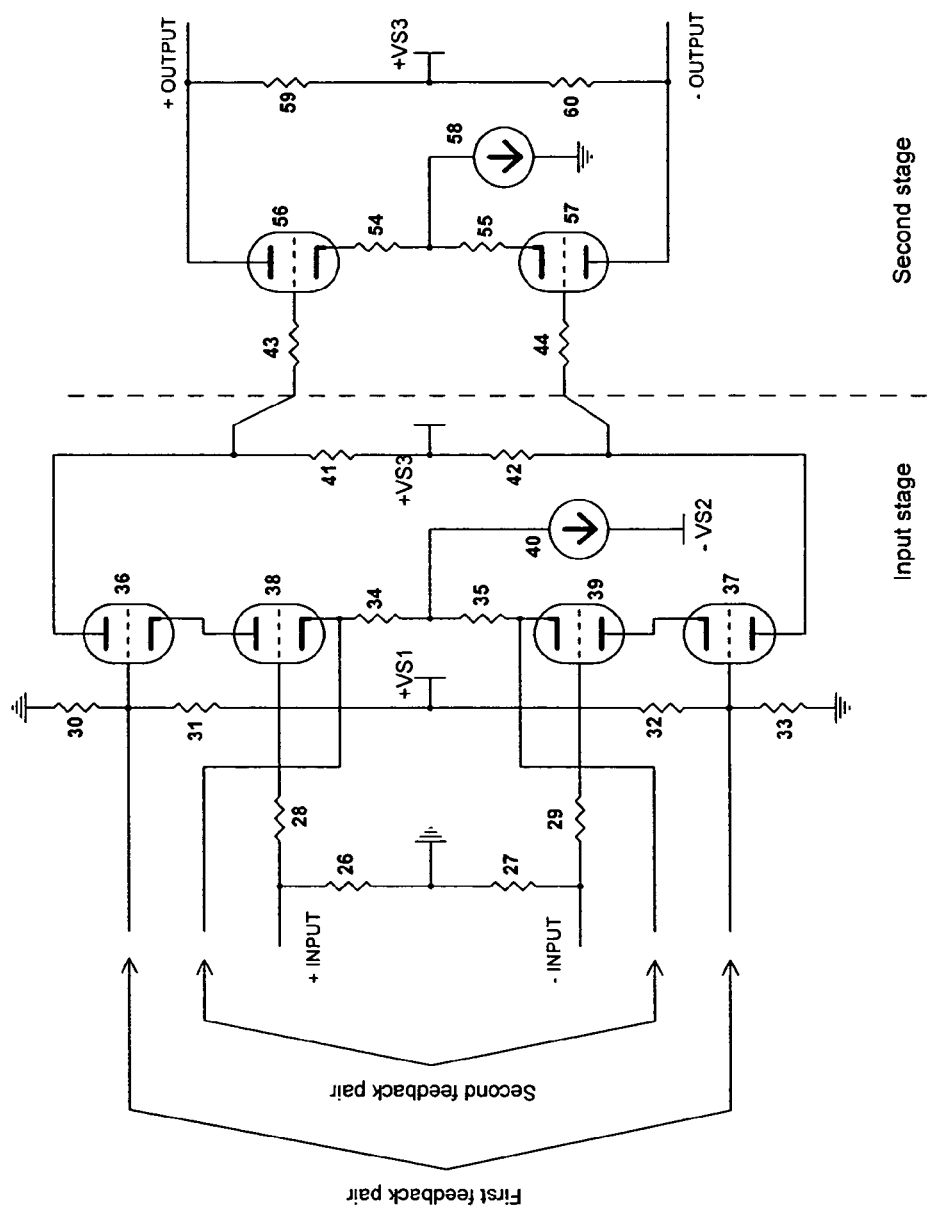
FIG. 2B shows a detailed circuit arrangement of a vacuum tube balanced amplifier according to a second embodiment of the present invention, which is a simplified version of that shown in FIG. 2A.

The balanced amplifier shown in FIG. 2B is a simplified version of that shown in FIG. 2A. The arrangement in FIG. 2B is derived from that shown in FIG. 2A, but with the pair of vacuum tubes 49 and 50 removed. The balanced amplifier in FIG. 2B has similar electrical properties to that in FIG. 2A, namely, two pairs of feedback paths are provided. The only major difference is that the driving capability of the circuitry in FIG. 2B is less than that in FIG. 2A. In most applications, this is not critical.

Figure 3:
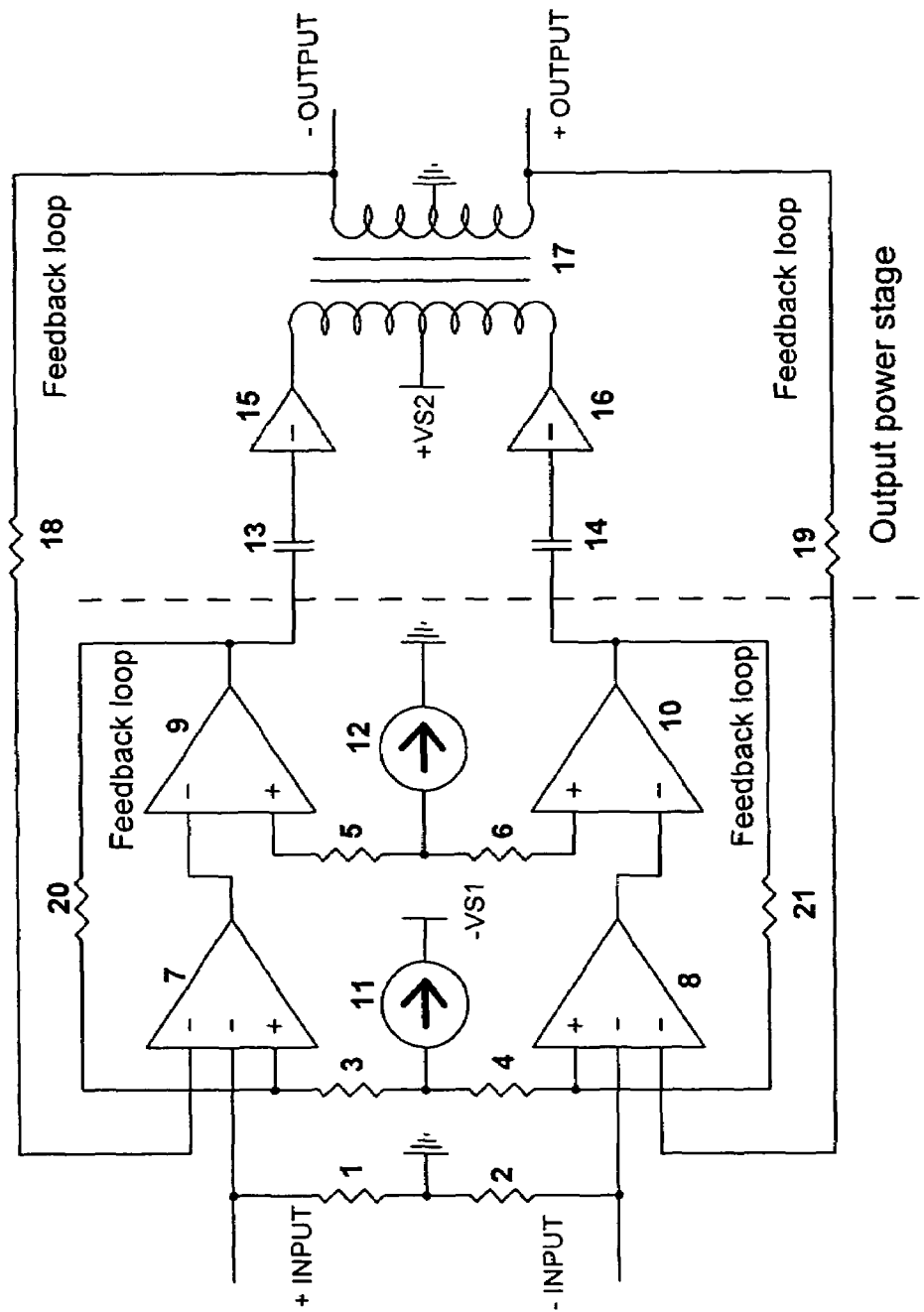
FIG. 3 is a functional block diagram of a balanced audio power amplifier in push-pull configuration, according to a third embodiment of the present invention.
Figure 4:
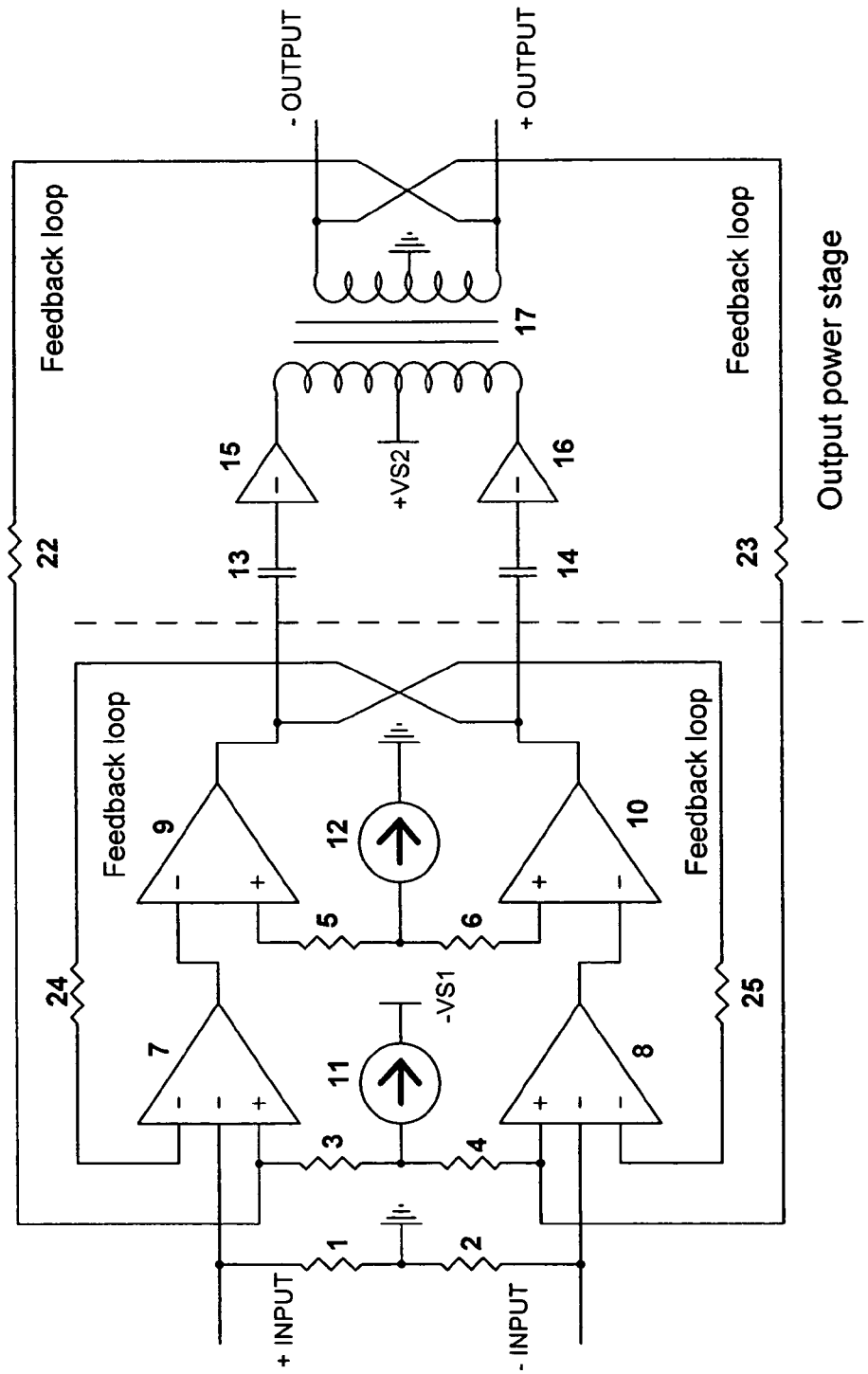
FIG. 4 is a functional block diagram of a balanced amplifier according to a fourth embodiment of the present invention.
Figure 5A:
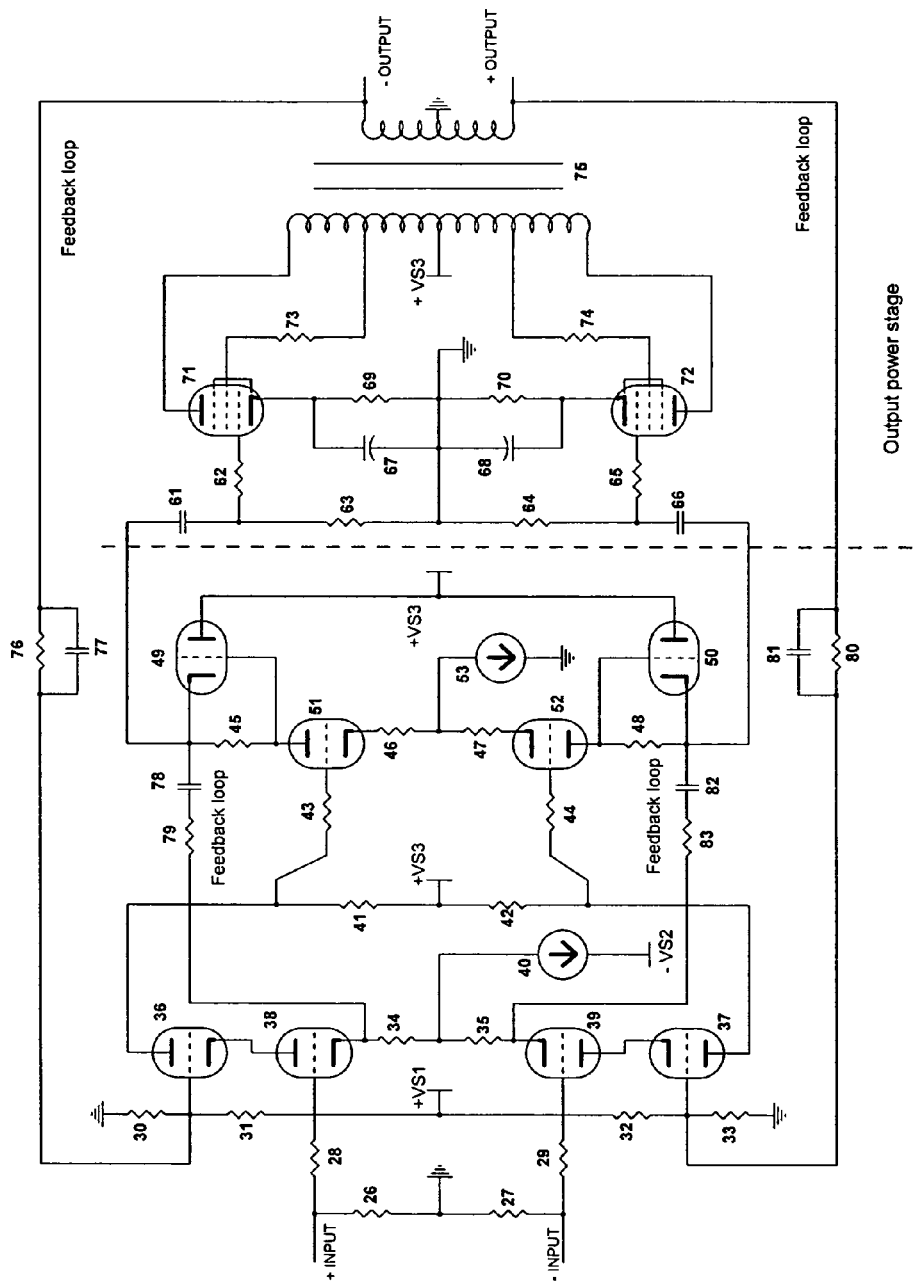
FIG. 5A is a detailed circuit arrangement of the vacuum tube balanced power amplifier shown in FIG. 3.
Figure 6A:
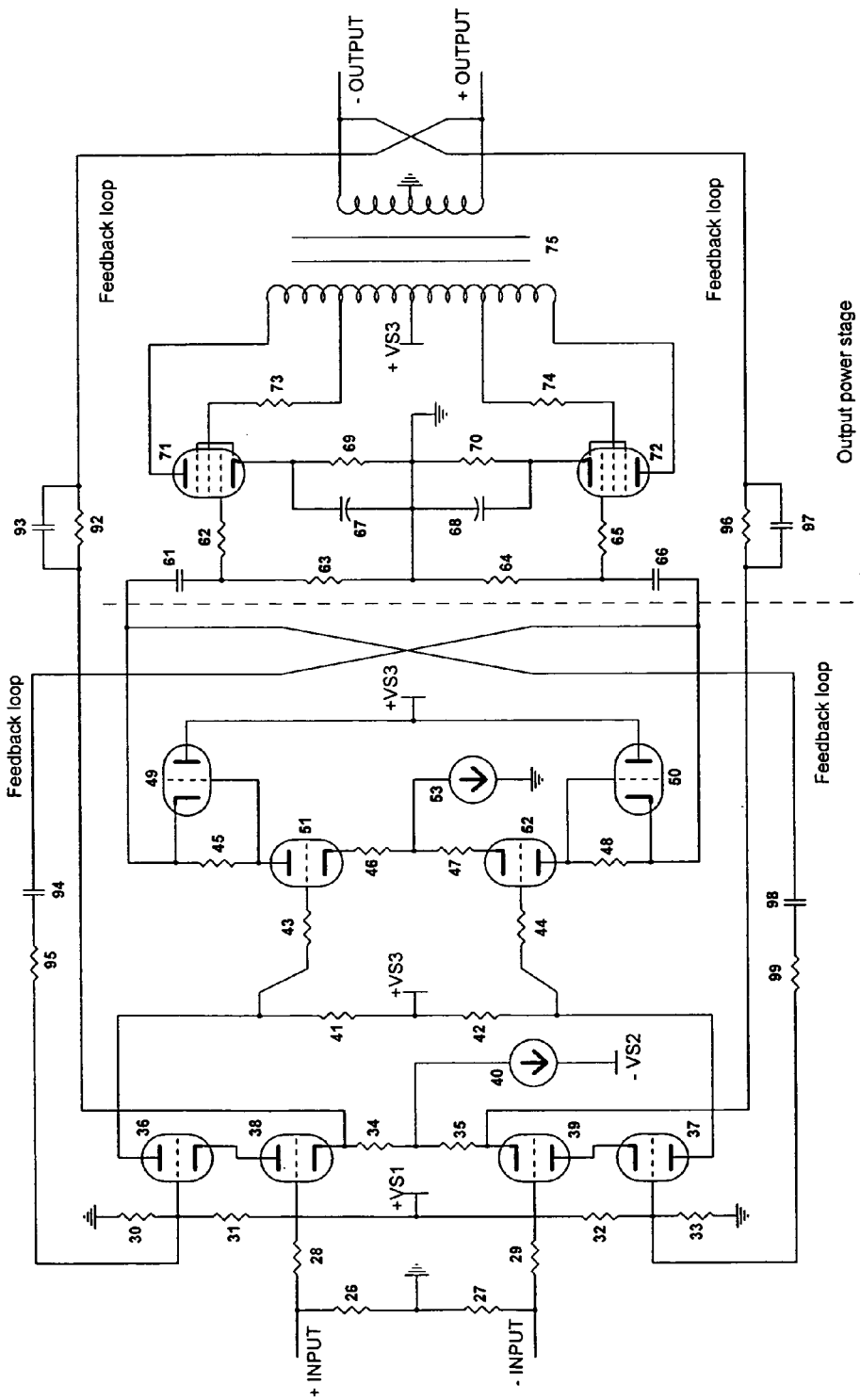
FIG. 6A is a detailed circuit diagram of the vacuum tube balanced power amplifier shown in FIG. 4.

FIGS. 3 and 4 are functional block diagrams showing how two audio power amplifiers can employ the new balanced amplifier circuit with two different feedback connections. FIGS. 5A and 6A show two complete balanced audio power amplifiers according to the functional block diagrams shown in FIGS. 3 and 4 respectively.

A balanced audio power amplifier employing the balanced amplifier of FIG. 1 and an additional output power stage is shown in FIG. 3. The output power stage is driven by the second stage via capacitors 13 and 14. Once the signals reach the output stage, the voltages and currents of the signals are further amplified by power devices 15 and 16 (such as power triodes, tetrodes, or pentodes). Finally, the amplified signals are then coupled to the output load by means of an output matching transformer 17. On the other hand, it is understood that, instead of using vacuum tube power devices, power semiconductor BJT or MOSFET devices can also be used as power devices 15 and 16, in which case no output matching transformer is required.

The balanced audio power amplifier depicted in FIG. 4 has identical configuration as of FIG. 3 except that the two pairs of feedback loops are connected differently from that of FIG. 3.

As shown in FIGS. 5A and 6A, the output power stage contains a pair of power tubes 71, 72 connected in the well-known push-pull "ultra-linear" configuration. The tubes can be any of the commonly used power tubes such as 6L6, 6V6, EL34, EL84, KT88, KT90 and 6550, etc. The power tubes 71 and 72 are cathode biased via the cathode resistors 69, 70 and bypass capacitors 67 and 68. This type of biasing technique is referred to as "self-biasing". Alternatively, fixed biasing can be used instead of self-biasing. The outputs from the power tubes are matched to the output load via an output transformer 75. FIGS. 5A and 6A show two different ways of connecting the two pairs of feedback loops according to the configuration shown in FIGS. 3 and 4, respectively.

Figure 5B:
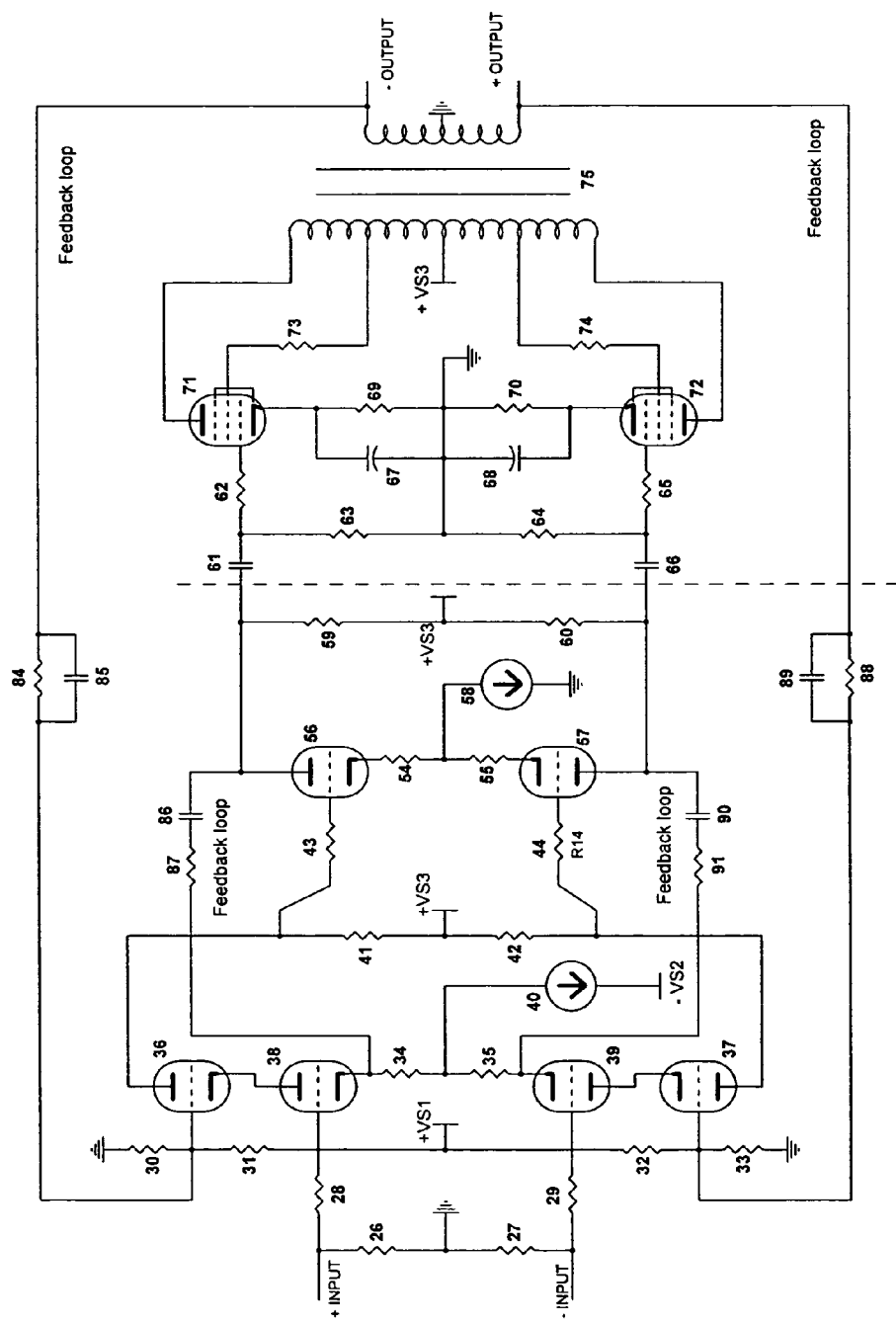
FIG. 5B is a detailed circuit arrangement of a vacuum tube balanced power amplifier according to FIG. 3, as simplified in the same principle according to FIG. 2B.
Figure 6B:
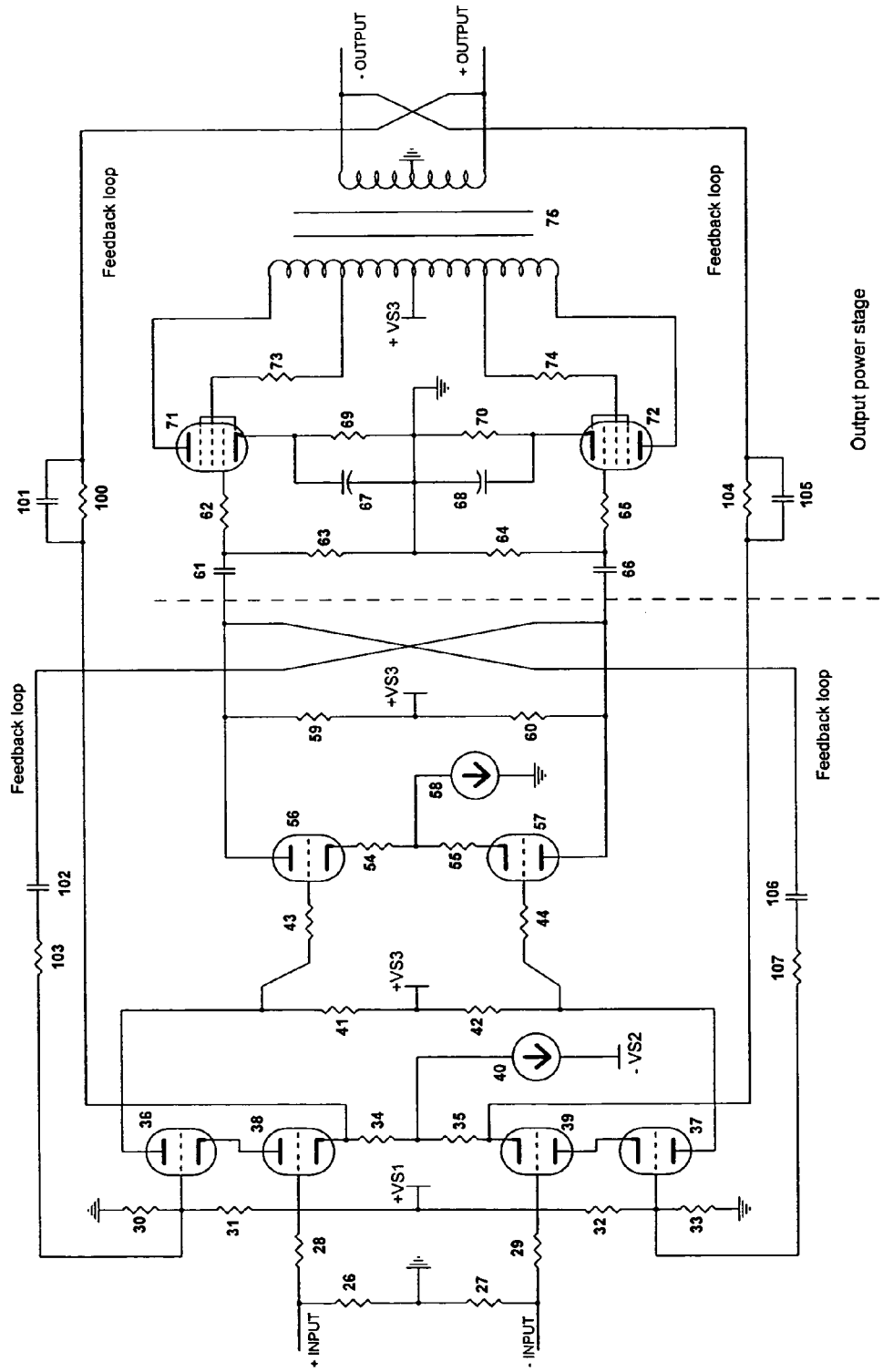
FIG. 6B is a detailed circuit arrangement of a vacuum tube balanced power amplifier according to FIG. 4, as simplified in the same principle according to FIG. 2B.
Figure 7:
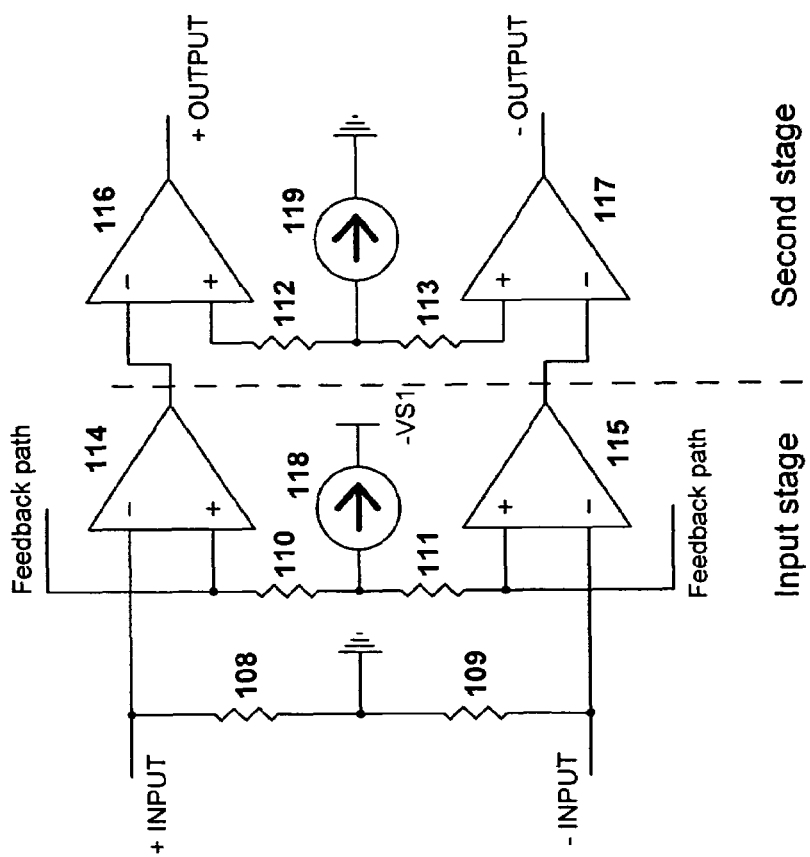
FIG. 7 is a functional block diagram of a conventional balanced amplifier using one pair of feedback paths.
Figure 8:
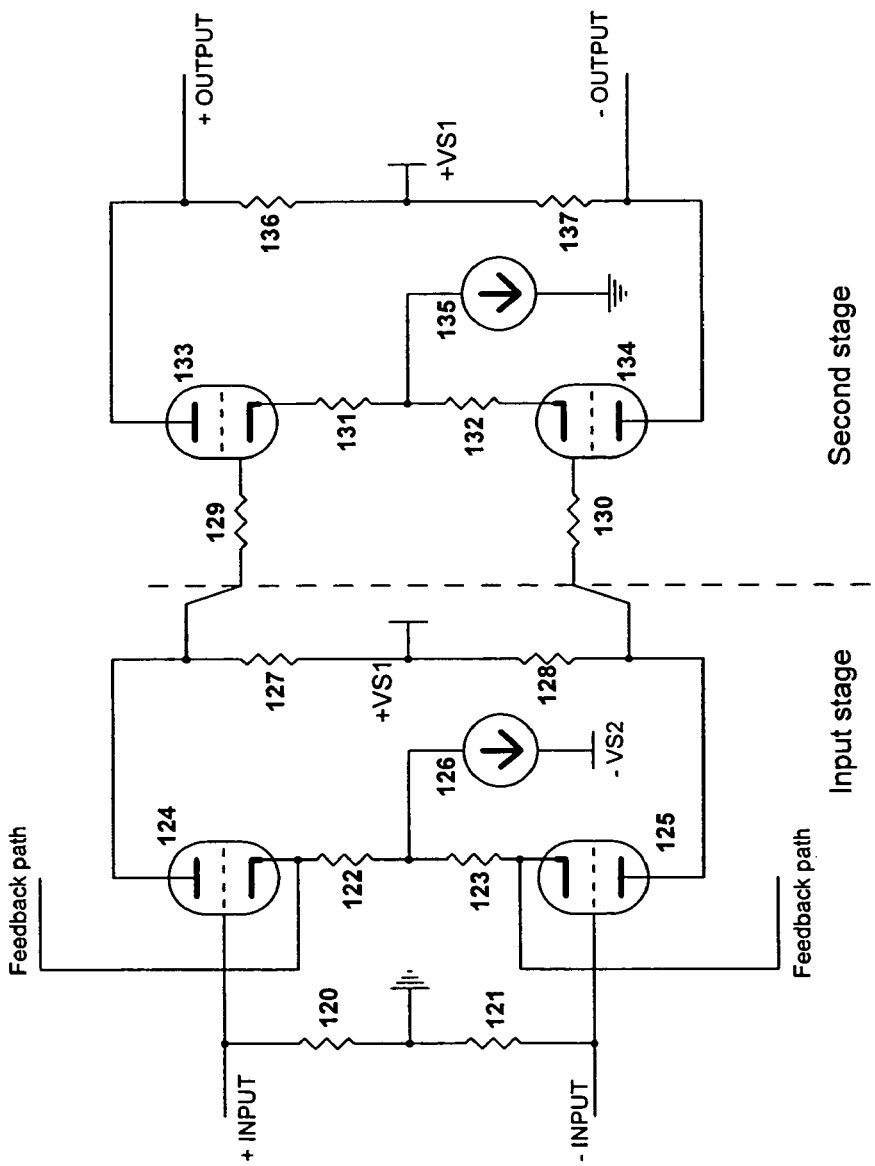
FIG. 8 is a detailed circuit arrangement of the conventional balanced amplifier shown in FIG. 7.
Figure 9:
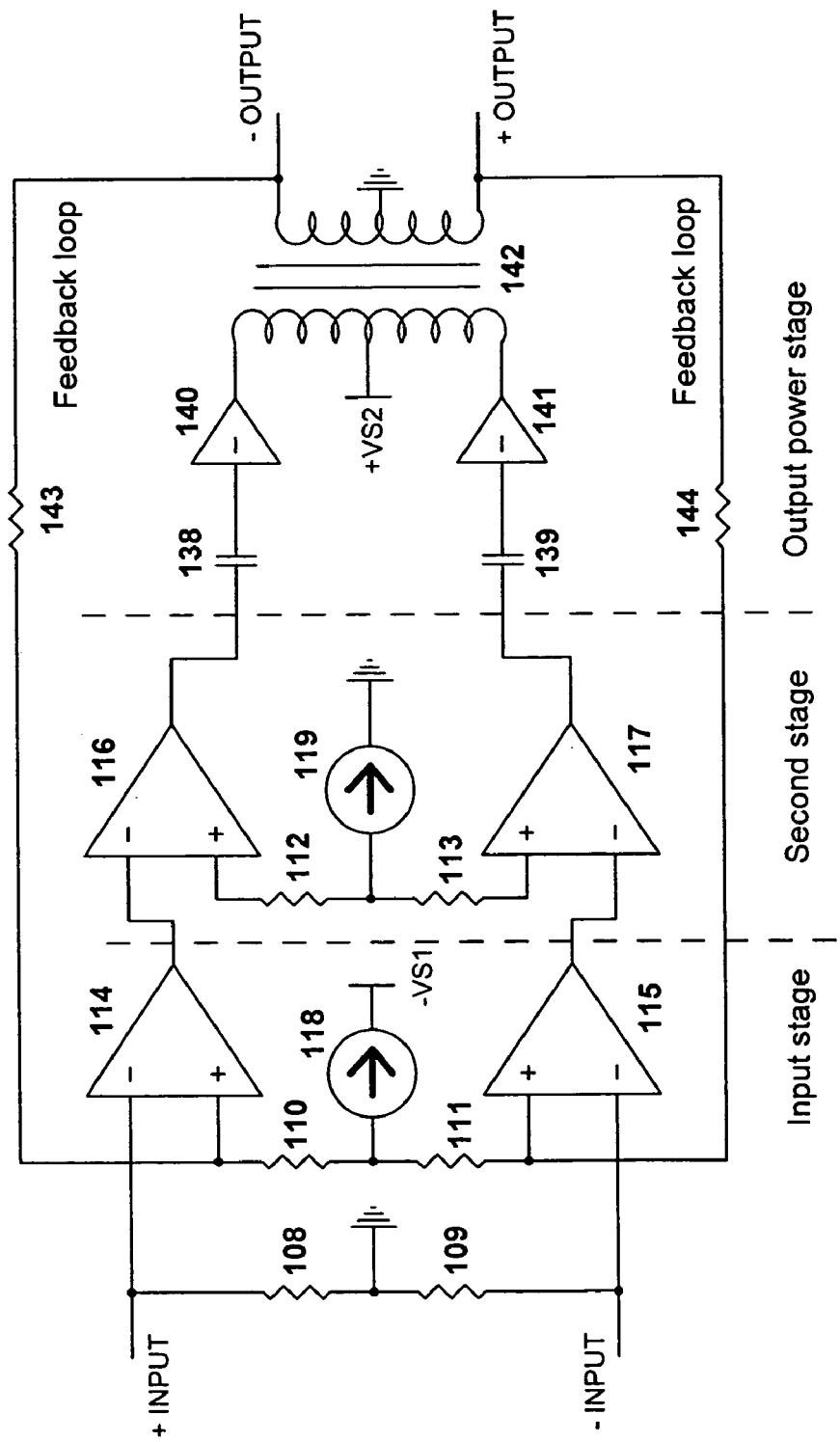
FIG. 9 is a functional block diagram of a conventional balanced audio power amplifier in push-pull configuration that employs the conventional balanced amplifier topology for the first two stages.
Figure 10:
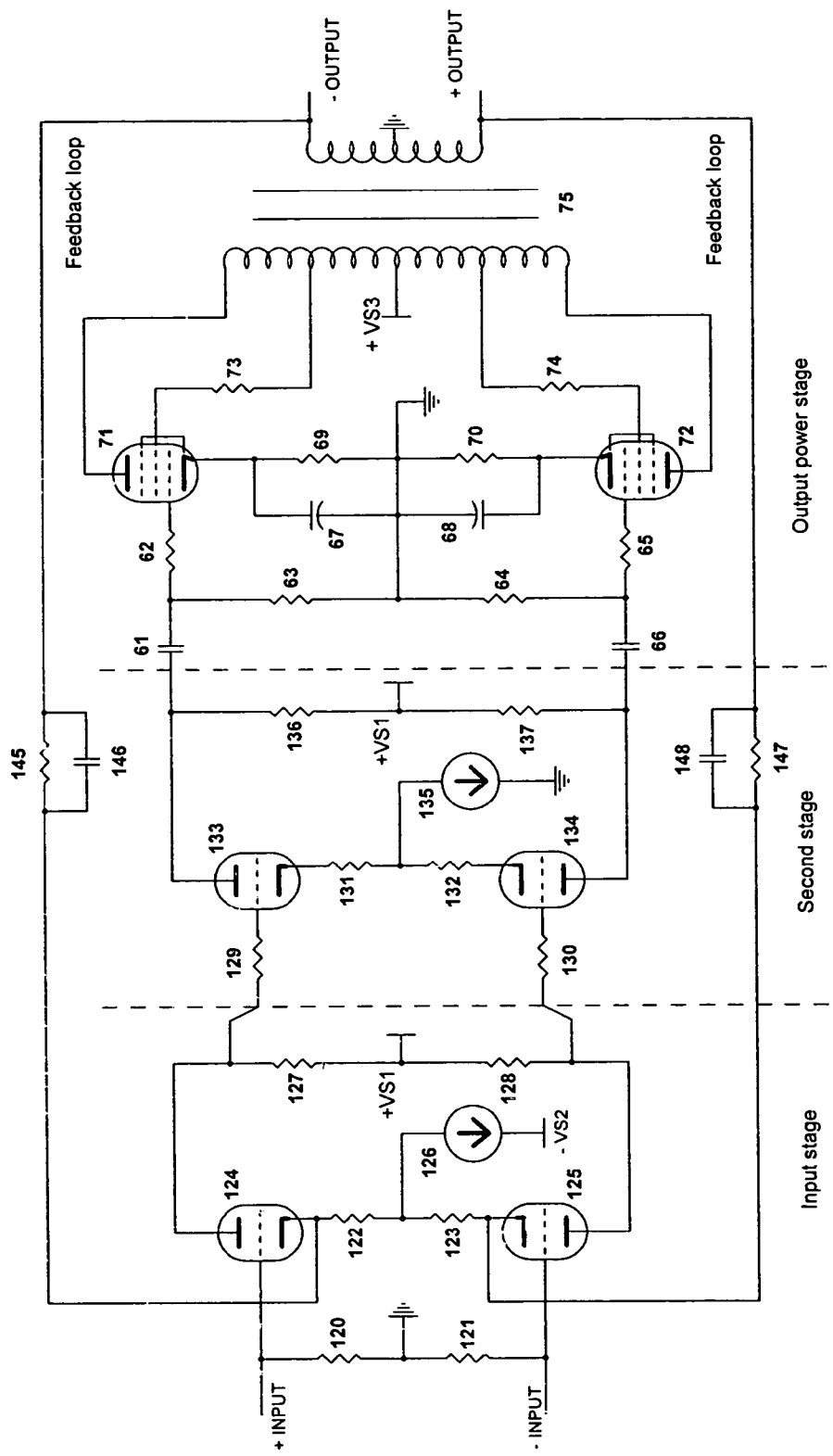
FIG. 10 is a detailed circuit arrangement of the conventional balanced amplifier shown in FIG. 9.

As to FIGS. 5B and 6B, such are respectively simplified versions of the circuit arrangement shown in FIGS. 5A and 6A, but with one pair of vacuum tubes 49 and 50 removed.

It can be easily seen from FIGS. 5A and 5B that the biasing resistors 30 and 33 can be omitted from the circuit. In such a case, the feedback resistors 76 and 80 of FIG. 5A and resistors 84 and 88 of FIG. 5B can function as both biasing and feedback resistors.

It can be seen that, in a new vacuum tube balanced amplifier according to this invention, two pairs of feedback loops are provided. The first pair of feedback loops may be applied between the input and second stage, whereas the second pair of feedback loops may be applied between the input and output power stage. Since two pairs of feedback loops are used, the total amount of feedback can be distributed in the two pairs of feedback loops in many different ways. Thus, each pair of feedback loops may carry only a small amount of feedback. By applying the right amount of feedback on each pair of feedback loops, a designer can obtain a balanced amplifier with optimized performance.

The advantages of this new invention of using two pairs of feedback loops include:
(a) As the first pair of feedback loops are connected between the input and second stage, the linearity and bandwidth are increased and the output impedance is reduced for these two stages. These are very desirable effects, in particular before the signal is amplified by the output power stage.
(b) Each pair of feedback loops only carry small amount of feedback and hence, the overall stability of the amplifier can be easily controlled. With two pairs of feedback loops, a designer has a much higher degree of freedom in optimizing the performance of the overall power amplifier so as to obtain the desired performances without jeopardizing the amplifier stability.

It should be understood that the above only illustrates examples whereby the present invention may be carried out, and that various modifications and/or alterations may be made thereto without departing from the spirit of the invention.

It should also be understood that certain features of the invention, which are, for clarity, described in the context of separate embodiments, may be provided in combination in a single embodiment. Conversely, various features of the invention which are, for brevity, described in the context of a single embodiment, may also be provided separately or in any appropriate sub-combinations.

The invention claimed is:

1. A balanced amplifier comprising at least an input stage connected with a second stage, wherein said input stage is adapted to output signals to said second stage, wherein said first stage includes a first differential amplifier adapted to receive balanced input signals and is provided with two pairs of feedback loops, wherein at least one said pair of feedback loops are adapted to feedback part of signals outputted by said second stage to said first differential amplifier, and wherein said second stage includes a second differential amplifier adapted to amplify signals received from said first stage and is adapted to maintain said balanced signals.

2. A balanced amplifier according to claim 1 wherein said first stage includes a first pair and a second pair of vacuum tubes forming said first differential amplifier, wherein said first pair of vacuum tubes are adapted to amplify said input signals, wherein said first pair of vacuum tubes are connected with each other via two resistors between their respective cathodes, and wherein a resistor or a substantially constant current source is connected from the junction of said two resistors to a negative DC power supply.

3. A balanced amplifier according to claim 2 wherein said current source comprises a JFET, MOSFET, BJT, a vacuum tube device with complementary zener diode and resistors, or a resistor.

4. A balanced amplifier according to claim 2 wherein the cathodes of said second pair of vacuum tubes of said first stage are connected respectively to the plates of said first pair of vacuum tubes, and wherein a potential divider connects between a positive DC power supply and a ground.

5. A balanced amplifier according to claim 4 wherein said potential divider comprises four resistors.

6. A balanced amplifier according to claim 4 wherein said potential divider is adapted to set up a DC biasing voltage at the grids of said second pair of vacuum tubes.

7. A balanced amplifier according to claim 2 wherein outputs of said first stage are given via two load resistors connected between the plates of said second pair of vacuum tubes and a positive DC power supply.

8. A balanced amplifier according to claim 7 wherein output signals of said first stage are adapted to be directly coupled to said second stage via two resistors which are connected between the plates of said second pair of vacuum tubes of said first stage and a pair of vacuum tubes of said second stage.

9. A balanced amplifier according to claim 1 wherein said second stage comprises a differential amplifier with a first and a second pair of vacuum tubes, wherein said first pair of vacuum tubes of said second stage are adapted to amplify inputs from said first stage, and wherein said first pair of vacuum tubes of said second stage are connected with each other via two resistors between their respective cathodes, and wherein a substantially constant current source is connected from the junction of said two resistors to a ground.

10. A balanced amplifier according to claim 9 wherein said current source comprises a JFET, MOSFET, BJT, a vacuum tube device with complementary components zener diode and resistors, or a resistor.

11. A balanced amplifier according to claim 9 wherein the cathodes of said second pair of vacuum tubes of said second stage are connected respectively to the plates of said first pair of vacuum tubes of said second stage, wherein grids of said second pair of vacuum tubes of said second stage are connected to plates of said first pair of vacuum tubes of said second stage.

12. A balanced amplifier according to claim 11 wherein a positive DC power supply is applied to the plates of said second pair of vacuum tubes of said second stage.

13. A balanced amplifier according to claim 11 wherein the overall outputs of the balanced amplifier are adapted to be given via the cathodes of said second pair of vacuum tubes of said second stage.

14. A balanced amplifier according to claim 1 wherein said second stage includes a pair of vacuum tubes connected with each other via two resistors between their respective cathodes, and wherein a resistor or a substantially constant current source is connected from the junction of said two resistors to a ground.

15. A balanced amplifier according to claim 14 wherein said current source comprises a JFET, MOSFET, BJT, a vacuum tube device with complementary components zener diode and resistors, or a resistor.

16. A balanced amplifier according to claim 14 wherein a positive DC power supply is applied to the plates of said pair of vacuum tubes of said second stage via two load resistors.

17. A balanced amplifier according to claim 1 comprising a balanced audio power amplifier further including a power output stage.

18. A balanced amplifier according to claim 17 wherein a first of said two pairs of feedback loops connect output of said second stage to said second pair of feedback loops on said first stage and a second of said two pairs of feedback loops connect output of said power output stage to said feedback loop on said first stage.

19. A balanced amplifier according to claim 17 wherein a first of said two pairs of feedback loops connect the crossed-output of said second stage to said first pair of feedback pair on said input stage, and a second of said two pairs of feedback loops connect the crossed-output of said power output stage to the second feedback pair on said first stage.

20. A balanced amplifier according to claim 17 wherein said power output stage includes a pair of power triodes, tetrodes or pentodes in self-biasing or fixed-biasing and drives an output matching transformer.

* * * * *